United States Patent [19]

Suzuki et al.

[11] Patent Number: 5,506,091
[45] Date of Patent: Apr. 9, 1996

[54] PHOTOSENSITIVE RESIN COMPOSITION AND METHOD OF FORMING CONDUCTIVE PATTERN

[75] Inventors: Toshio Suzuki; Toshinori Marutsuka, both of Tokyo, Japan

[73] Assignee: Nisshinbo Industries, Inc., Tokyo, Japan

[21] Appl. No.: 123,039

[22] Filed: Sep. 20, 1993

Related U.S. Application Data

[63] Continuation-in-part of Ser. No. 686,942, Apr. 18, 1991, abandoned.

[30] Foreign Application Priority Data

| Apr. 20, 1990 | [JP] | Japan | 2-103018 |
| May 18, 1990 | [JP] | Japan | 2-126640 |
| Sep. 19, 1990 | [JP] | Japan | 2-247203 |

[51] Int. Cl.$^6$ ............................. G03C 5/58; G03F 7/30
[52] U.S. Cl. ............................. 430/324; 430/311; 430/315; 430/270.1; 430/325; 430/327; 430/330; 427/98; 427/229; 427/305; 427/510
[58] Field of Search ............................. 430/330, 324, 430/325, 327, 311, 315, 270; 427/98, 305, 229, 510

[56] References Cited

U.S. PATENT DOCUMENTS

| 3,779,758 | 12/1973 | Polichette | 430/315 |
| 3,900,320 | 8/1975 | Rolker et al. | 430/315 |
| 3,904,784 | 9/1975 | Nara et al. | 427/98 |
| 4,948,707 | 8/1990 | Johnson et al. | 430/330 |
| 4,981,715 | 1/1991 | Hirsch et al. | 427/98 |
| 5,045,436 | 9/1991 | Tieke et al. | 430/324 |

FOREIGN PATENT DOCUMENTS

| 0319263 | 6/1989 | European Pat. Off. . | |
| 0347114 | 12/1989 | European Pat. Off. . | |
| 0348962 | 1/1990 | European Pat. Off. . | |
| 58-147550 | 9/1983 | Japan | 427/304 |
| 1-315334 | 12/1989 | Japan . | |
| 9003597 | 4/1990 | WIPO | 430/330 |

OTHER PUBLICATIONS

Anonymous Disclosure, Research Disclosures, Dec. 1973, pp. 30–31.

*Primary Examiner*—Janis L. Dote
*Attorney, Agent, or Firm*—Wenderoth, Lind & Ponack

[57] ABSTRACT

A photosensitive resin composition formed by dissolving a photosensitive resin and a metallic salt or a metal complex in a common solvent or by dispersing reduced metal colloid particles in a photosensitive resin. Also disclosed is a method of forming electrically conductive patterns by applying the photosensitive resin composition to a substrate, pre-baking the resin and then successively subjecting it to exposure, development and post-baking. The result is subjected to electroless plating, directly in the case of the photosensitive resin containing dispersed metal colloid particles, and after reducing the metallic salt or a metal complex to a metal in the case of the photosensitive resin composition containing a metallic salt or metal complex. The reduction of the metallic salt or metal complex is conducted after pre-baking or one of the ensuing steps.

6 Claims, No Drawings

PHOTOSENSITIVE RESIN COMPOSITION AND METHOD OF FORMING CONDUCTIVE PATTERN

This application is a continuation-in-part of application Ser. No. 07/686,942, filed Apr. 18, 1991, now abandoned.

BACKGROUND OF THE INVENTION

1. Field of the Invention

This invention relates to a photosensitive resin composition for forming electrically conductive patterns and to a method for using the photosensitive resin composition to form such patterns.

The conductive patterns formed by the invention are used as printed circuits, electrodes, heating elements and the like.

2. Description of the Background Art

Typical of the conventional methods for forming conductive patterns are (1) the pattern printing process using conductive paste, (2) the subtractive process in which the conductive pattern is formed by etching a copper-plated laminate to remove nonpattern regions, and (3) the additive process in which a plating resist pattern (negative) is formed on a substrate and the remaining portions are selectively plated.

Among the shortcomings of method (1) are that the conductivity of the pattern, the adhesive strength of the paste and the pattern precision are low while the production cost is high. As relates to application of the method in the printed circuit field, moreover, it is not practical from the point of through-hole continuity and the fact that the paste exhibits low soldering heat resistance.

Method (2) has problems in that the process is complex, fine pattern features are difficult to form and the plating adhesion at through-hole portions is less than satisfactory. What is more, the method has already matured to the point where further substantial improvements cannot be expected.

Method (3) was developed to eliminate waste arising from the removal of nonpattern portions by etching and to respond to demands for higher wiring density and reliability. However, since the catalyst-containing resin layer that the plating is applied to is not patterned, its electrical insulation property is poor. Further, the method does not enable easy formation of fine patterns, the catalyst contained in the substrate further impairs the insulation property, the strength and other physical properties are inferior, the cost of catalyst is high, the plating adherence is low, and roughening is required prior to plating.

SUMMARY OF THE INVENTION

The object of the present invention is to provide an improvement of the aforesaid additive method which enables an increase in plating adhesion without need for roughening, simplification of the pattern forming process, and improvement of pattern precision.

For attaining this object, one aspect of the present invention provides a photosensitive resin composition formed by dissolving a photosensitive resin and a metallic salt or a metal complex in a common solvent and a method of forming electrically conductive patterns in which the photosensitive resin composition is applied in a prescribed pattern to a substrate, the patterned substrate is pre-baked and then successively subjected to exposure, development and post-baking, the metallic salt or metal complex being treated with a reducing agent to reduce it to a metal after the pre-baking step or one of the ensuing steps, and electroless plating is conducted on the metal with the metal acting as a catalyst.

Another aspect of the invention provides a photosensitive resin composition formed by dispersing reduced metal colloid particles in a photosensitive resin and a method of forming electrically conductive patterns in which the photosensitive resin composition is applied in a prescribed pattern to a substrate, the patterned substrate is pre-baked and then successively subjected to exposure, development and post-baking, and electroless plating is conducted on the result.

DESCRIPTION OF THE PREFERRED EMBODIMENT

The substrate used in the present invention is selected on the basis of the intended application and is not particularly limited. Examples of usable substrates are copper-plated laminated sheet, metal sheet, plastic sheet, plastic film and ceramic sheet.

The photosensitive resin used in the first aspect of this invention has to be soluble in a solvent in which the metallic salt or metal complex is also soluble and has to have affinity for the metallic salt or metal complex. Insofar as it meets these requirements, however, it can be of any kind or type (negative or positive type). It can be any of the photosensitive resins in general use, among which there can be specifically mentioned photosensitive polyimide and novolac resin, cyclized natural rubber, cyclized synthetic rubber, polyvinylcinnamate, polymethylisopropenylketone, polyvinylphenol, polyvinyl-p-azidobenzoate, polymethacryloyloxybenzalacetophenone, polyvinylalcohol, added with a photosensitive agent, or the like.

The metallic salt or metal complex used in this aspect of the invention is required to manifest plating catalyst activity when reduced to a metal by a reducing agent in the manner to be explained later and, as was explained earlier, is also required to be soluble in a common solvent with the photosensitive resin. It can be either an organic or inorganic metallic salt but is preferably an inorganic metallic salt or an organic metal complex. It should also preferably be stable with respect to the atmosphere and moisture. As specific examples of metallic salts that can be used in the first aspect of the invention there can be mentioned sulfates, nitrates, chlorides and organic salts (e.g. acetates) of such Group Ib and Group VIII elements of the Periodic Table as iron, cobalt, nickel, copper, rhodium, palladium, silver, platinum and gold.

As specific examples of metal complexes that can be used in the first aspect of the invention there can be mentioned benzonitrile metal complex, acetylacetone metal complex and ammonia metal complex of such Group Ib and Group VIII elements of the Periodic Table as iron, cobalt, nickel, copper, rhodium, palladium, silver, platinum and gold. These metallic salts or metal complexes can be used singly or in combinations of two or more.

While the ratio between the amount of the metallic salt or metal complex and the amount of the photosensitive resin used varies widely depending on the physical properties required of the film on which plating is carried out, the type of metallic salt or metal complex used and other factors, it is preferable to use 5–100 parts by weight of the metallic salt or 1–100 parts by weight of the metal complex per 100 parts by weight of the photosensitive resin.

As the common solvent for both the photosensitive resin and the metallic salt or the metal complex there can be mentioned chloroform, methylene chloride, trichloroethylene, tetrachloroethylene, benzene, toluene, xylene, acetone, ethyl acetate, dimethylformamide, dimethylsulfoxide, dimethylacetamide and N-methylpyrrolidone. These solvents can be used singly or in mixtures and the selection of the solvent is made appropriately based on the combination of photosensitive resin and metallic salt or metal complex to be used. The amount of solvent used with respect to the amount of photosensitive resin is selected so as to obtain an appropriate viscosity and fluidity and to make the solution appropriate for application to the shaped article to be provided with the conductive pattern.

The solution obtained by dissolving the photosensitive resin and the metallic salt or metal complex in the solvent is applied to the surface of a substrate of the desired shape to form thereon a film containing the metallic salt or metal complex. The application of the solution can be carried out by brush, spraying, dipping or other conventional method selected in view of the shape of the substrate.

The conditions (temperature, time) for film formation are determined based on the type and concentration of the photosensitive resin, the film thickness and the like. The nonvolatile content of the solution is normally 5–20 wt %. The dry thickness of an applied film after the post-baking is usually 0.1–10µ.

If the dry thickness is less than 0.1µ, the amount of catalyst is smaller than the necessary amount of electroless plating and it becomes difficult to plate.

If the dry thickness is more than 10µ, plated metal continues on the surface to give lustre and it becomes difficult to develop.

After the film has been formed, it is tightly covered with a mask (negative or positive film) and exposed to light. The amount of exposure at this time can be appropriately adjusted in accordance with the intended purpose of the conductive pattern being formed, based on a prescribed standard amount of exposure required for patterning with the photosensitive resin composition used.

After exposure to light, the film is patterned by development using a developing solution specific for the film. The nonpattern portions (the unexposed portions in the case of a negative film) need not necessarily be dissolved away resin and all, and the desired pattern can alternatively be obtained by removal of only the metallic salt or metal complex by dispersion.

While the reducing treatment is ordinarily conducted after post-baking (curing), it can alternatively be conducted after pre-baking, exposure or development. But, the reducing treatment is preferably conducted before development to avoid continuity of electricity between the metal plating layer and the substrate. The treatment with the reducing agent causes precipitation of the metallic salt or metal complex contained in the film to be concentrated at the film surface and results in the formation of a layer of reduced metal (plating catalyst) partially embedded in and integral with the film. Since this layer is integral with the film, it exhibits extraordinarily good adherence with the plating. Moreover, since the metal particles precipitate at and project from the surface, no need arises for the roughening required in the conventional additive process.

As the reducing agent in this invention there is used one capable of reducing the metallic salt or metal complex to metal, specific examples being $FeSO_4$, sodium hypophosphite, sodium borohydride, aminoborane, dimethylaminoborane, hydroxylamine sulfate, hydrosulfite and the like.

These reducing agents are normally used in the form of aqueous solutions. However, this is not limitative and any solvent system capable of dissolving the reducing agent can be used. The concentration of the reducing agent in the solution can be appropriately varied depending on the intended purpose of the conductive pattern being formed. It is generally 0.01–20 wt %, preferably 0.05–10 wt %, and more preferably 0.1–7 wt %.

The reduction can be carried out by a simple method such as by immersing the substrate having the film containing the metallic salt or metal complex in the reducing solution for an appropriate length of time or by spraying the reducing solution onto the film.

The reduction is preferably carried out at between 10° C. and 90° C. with contact between the film and the reducing agent solution being maintained for an appropriate period of between 10 seconds and 30 minutes. The film can be preheated before reduction.

Removal of the solvent from the film before reduction can be either complete or incomplete. When the solvent is completely removed, it is preferable either to use a slightly higher reducing solution temperature or to preheat the film before reduction. Preheating the film increases the reduction efficiency.

Although the reduction is ordinarily continued at least until substantially all of the metallic salt or metal complex present in the surface layer has been reduced, it can be discontinued earlier if necessary.

Once the pattern for plating has been formed on the film in the aforesaid manner, it is subjected to an electroless plating process for forming a conductive pattern of a prescribed metal. The electroless plating is conducted by a conventional method selected in view of the intended use of the conductive pattern. Ni plating and Cu plating are typical examples.

In the method according to the first aspect of the present invention, the adhesive strength, hardness, plating catalytic activity and the like of the film pattern for plating can be regulated in response to the circumstances by appropriate selection of the type of photosensitive resin and metallic salt or metal complex used, and also by controlling the patterning conditions (exposure, development), the reducing agent treatment conditions and other such operating conditions.

Differently from in the first aspect of the invention in which a photosensitive resin and a metallic salt or a metal complex are dissolved in a common solvent, in the second aspect of the invention reduced metal colloid particles are dispersed in the photosensitive resin. This second aspect of the invention will now be explained in detail.

The photosensitive resin used in the second aspect of this invention has to be soluble in the solvent in which the reduced metal colloid particles are dispersed and has to have affinity for the reduced metal colloid particles. Insofar as it meets these requirements, however, it can be of any kind or type (negative or positive type). It can be any of the photosensitive resins in general use, among which there can be specifically mentioned photosensitive polyimide and novolac resin, cyclized natural rubber, cyclized synthetic rubber, polyvinylcinnamate, polymethylisopropenylketone, polyvinylphenol, polyvinyl-p-azidobenzoate, polymethacryloyloxybenzalacetophenone, polyvinylalcohol, added with a photosensitive agent, or the like.

The reduced metal colloid particles dispersed in the photosensitive resin act as an electroless plating catalyst and enhance the plating adherence.

It is preferable to use reduced metal colloid particles which exhibit high plating catalytic activity and good dispersability in the photosensitive resin. They should also preferably exhibit good stability with respect to atmospheric air and moisture. As specific examples of reduced metal colloids that can be used in the second aspect of the invention there can be mentioned those set out in Japanese Unexamined Patent Public Disclosure No. 1(1989)-315334, specifically such Group VIII elements of the Periodic Table as iron, cobalt, nickel, rhodium and palladium. It is also possible to use such Group Ib elements of the same table as gold, silver and copper. These metals can be used singly or in combinations of two or more.

While the ratio between the amount of the reduced metal colloid particles and the amount of the photosensitive resin used can be varied widely in accordance with the physical properties required of the film on which plating is carried out, the type of reduced metal colloid particles used and other factors, it is preferable to use 5–100 parts by weight of the reduced metal colloid particles per 100 parts by weight of the photosensitive resin.

Where metals falling in Group VIII of the Periodic Table are used, the reduced metal colloid particles can be produced by the method disclosed in the aforesaid Japanese Unexamined Patent Public Disclosure No. 1(1989)-315334, namely by reduction of a metallic salt in a mixed solvent consisting of a lower alcohol and an aprotic polar compound. The same method can also be used for Group Ib metals.

Typical lower alcohols that can be used include methanol and ethanol, while typical aprotic polar compounds for use in this aspect of the invention include such amide compounds as formamide and dimethylformamide.

The mixed solvent preferably contains 200–0.01 part by weight of the aprotic polar compound per 100 parts by weight of the lower alcohol.

As usable metallic salts there can be mentioned sulfates, nitrates, chlorides and organic salts (e.g. acetates).

The metallic salt is reduced by adding a reducing agent to the solution containing the metallic salt. As the reducing agent there can be used $NaBH_4$, $KBH_4$, $LiBH_4$, $(CH_3)_2NBH_3$, formaldehyde, stannous chloride, sodium hypophosphite, and the like. The reducing agent is added as a 0.1–5 wt % solution in the aforesaid lower alcohol, aprotic polar compound or mixed solvent prepared from these.

The reducing agent is preferably added in such an amount as to obtain a reducing electrochemical equivalent equal to 0.5–10 times that of the reduction electrochemical equivalent of the metal to be reduced.

A reduction temperature of 10°–30° C. is generally preferable. Although it is not absolutely necessary to stir the solution during the reduction reaction, it is better to do so since stirring enhances the reaction uniformity. Low-speed stirring suffices. The aforesaid operations result in the production of a very highly stable colloid dispersion liquid within several seconds to several tens of minutes.

The use of reduced metal colloid particles in this aspect of the invention ensures not only very fine dispersion of metal particles in the photosensitive resin but also excellent reduction efficiency. As a result, even an applied film of a dry thickness of a mere 0.5–5μ is able to provide a top-rate surface for electroless plating and to ensure strong plating adherence.

For dispersing the reduced metal colloid particles in the photosensitive resin it suffices first to dissolve the photosensitive resin in a solvent consisting of one or more of, for example, chloroform, methylene chloride, trichloroethylene, tetrachloroethylene, benzene, toluene, xylene, acetone, ethyl acetate, dimethylformamide, dimethylsulfoxide, dimethylacetamide and N-methylpyrrolidone and then to mix the resulting resin solution with the aforesaid colloid dispersion liquid.

The amount of solvent used with respect to the amount of photosensitive resin is selected so as to obtain an appropriate viscosity and fluidity and to make the solution appropriate for application to the substrate to be plated.

The photosensitive resin composition is applied to the surface of a substrate of the desired shape and then pre-baked to obtain an applied film containing reduced metal colloid particles. The application of the composition can be carried out by brush, spraying, dipping or other conventional method selected in view of the shape of the substrate.

The conditions (temperature, time) for film formation are determined based on the type and concentration of the photosensitive resin, the film thickness and the like. The nonvolatile content of the solution is normally 0.5–10 wt %.

After the film has been formed, it is tightly covered with a mask (negative or positive film) and exposed to light. The amount of exposure at this time can be appropriately adjusted in accordance with the intended purpose of the conductive pattern being formed, based on a prescribed standard amount of exposure required for patterning with the photosensitive resin composition used.

After exposure to light, the film is patterned by development using a developing solution specific for the film.

Ordinarily the developed pattern is post-baked (cured) and directly subjected to an electroless plating process for forming a conductive pattern of a prescribed metal. Alternatively, however, the post-baked pattern can, if necessary, be activated prior to electroless plating by immersion in a bath consisting of a warm aqueous solution of sodium hypophosphite or the like. The electroless plating is conducted by a conventional method selected in view of the intended use of the conductive pattern. Ni plating and Cu plating are typical examples.

In the method according to the second aspect of the present invention, the adhesive strength, hardness, plating catalytic activity and the like of the film pattern for plating can be regulated in response to the circumstances by appropriate selection of the type of photosensitive resin and reduced metal colloid particles used, and also by controlling the patterning conditions (exposure, development), the activating treatment conditions and other such operating conditions.

The invention will now be explained with reference to specific examples.

EXAMPLES

Example 1

24.75 parts (by weight; hereinafter the same) of $CoCl_2 \cdot 6H_2O$ and 0.25 parts $PdCl_2$ dissolved in N-methylpyrrolidone (NMP) were added to 100 parts of negative photosensitive polyimide (Lithocoat PI-400, product of Ube Industries, Ltd.) to obtain a mixed solution (resin concentration of 5 wt %).

A coat of the mixed solution was applied to the surface of a substrate film of Sunever B410 (polyimide varnish, product of Nissan Chemical Industries, Ltd.) formed on a glass plate and the result was pre-baked (dried) at 65° C. for 2 hours. After pre-baking, the applied film (thickness: 5μ) was directly covered with a stainless steel mask and exposed to ultraviolet light from a mercury lamp at an exposure rate of 1 J/cm$^2$.

The exposed film was then subjected to pattern formation by immersion in a developing solution (organic solvent type, 25° C.) specific for the photosensitive resin film for 5 minutes, whereafter it was rinsed for 1 minute each in solutions specified by the photosensitive resin manufacturer (first stage rinsing in an ethanol solution containing 5% N-methyl-2-pyrrolidone; second stage rinsing in ethanol).

The resulting pattern was heat treated at 160° C. for 30 minutes and at 230° C. for 30 minutes, subjected to reduction treatment by immersion in a 0.5% aqueous solution of sodium borohydride for 5 minutes, washed with water and immersed in a 50° C. Ni plating solution (Sumer S680, product of Japan Kanigen Co. Ltd.) for 5 minutes.

Gradual deposition of nickel started about 30 seconds after immersion in the plating solution and an electrically conductive pattern exhibiting metallic luster was obtained after 5 minutes. The surface resistivity of the conductive portion was 100 Ω and the masked portion exhibited insulating property. The adherence and pattern precision of the conductive pattern were good.

Example 2

A pattern for plating was obtained under the same conditions as in Example 1 except that the reducing treatment was conducted after rinsing in the development step. The result was immersed in a Ni plating solution for 3 minutes. About 5 seconds after immersion, nickel began to deposit simultaneously over the entire pattern surface and a conductive pattern like that in Example 1 was obtained after 3 minutes. The surface resistivity of the conductive portion was 10 Ω and the masked portion exhibited insulating property. The adherence and pattern precision of the conductive pattern were good.

Example 3

A pattern for plating obtained according to Example 2 was immersed in Enplate Cu-408 plating solution (product of Japan Meltex Inc.) at room temperature for 3 minutes. Deposition of copper started about 5 seconds after immersion and an electrically conductive pattern exhibiting coppery luster was obtained after 3 minutes. The surface resistivity of the conductive portion was 1 Ω and the masked portion exhibited insulating property. The adherence and pattern precision of the conductive pattern were good.

Example 4

A mask (negative film) produced by Toppan Printing Co., Ltd. was directly applied to the surface of a pre-baked film obtained according to Example 1 and then overlaid with a Pyrex glass plate. The result was exposed to light from a metal halide lamp at an exposure rate of 2 J/cm$^2$, immersed in a developing solution specific for the photosensitive resin film, and subjected to ultrasonic development for 3 minutes, whereby there was obtained a pattern. The pattern was nickel plated under the same conditions as in Example 2. As a result there was obtained a conductive pattern which had sharp pattern features in the linewidth range upward from 50 µm and also exhibited good conductivity.

Example 5

25 PHR of NiCl$_2$·6H$_2$O dissolved in dimethylformamide (DMF) was added to acrylic resin type negative etching resist (PMER N-D40P, product of Tokyo Ohka Kogyo Co., Ltd.) to obtain a mixed solution. A coat of the mixed solution was applied to the surface of a glass-epoxy substrate and pre-baked at 70° C. for 30 minutes to obtain an applied film.

The film was exposed through a directly overlaid mask to light from a mercury lamp (exposure rate: 1 J/cm$^2$) and then developed for 3 minutes by immersion with shaking in a developing solution, N-A5 (alkaline aqueous solution, 25° C.), specific for the photosensitive resin.

The so-obtained pattern was rinsed with water, post-baked at 120° C. for 30 minutes and immersed in a 0.5% aqueous solution of sodium borohydride for 3 minutes to reduce the metallic salt and prepare the pattern for plating. A conductive pattern was then obtained by conducting nickel plating under the same conditions as in Example 1. The adherence and pattern precision of the conductive pattern were good.

Example 6

25 PHR of CoCl$_2$·6H2O dissolved in DMF was added to novolac resin type positive etching resist (PMER P-DF 40S, product of Tokyo Ohka Kogyo Co., Ltd.) to obtain a mixed solution. A coat of the mixed solution was applied to the surface of a glass plate and pre-baked at 90° C. for 30 minutes. The film was exposed through a directly overlaid mask to light from a mercury lamp (exposure rate: 1 J/cm$^2$).

Following exposure, the film was developed for 3 minutes by immersion with shaking in a 25° C. developing solution specific for the photosensitive resin (aqueous alkaline type developing solution marketed as P-1S). The resulting pattern was rinsed with water, post-baked for 10 minutes at 140° C., and immersed in a 0.5% aqueous solution of sodium borohydride for 3 minutes to reduce the metallic salt and prepare the pattern for plating. Copper plating was then conducted under the same conditions as in Example 3 to obtain a conductive pattern. The adherence and pattern precision of the conductive pattern were good.

Example 7

A mixed solution having a photosensitive resin concentration of 5 wt % was prepared by adding 5 parts of Pd acetylacetonate (Pd-AA) dissolved in N-methylpyrrolidone (NMP) to 100 parts of a negative type photosensitive polyimide (Lithocoat PI-400, product of Ube Industries, Ltd.).

A coat of the mixed solution was applied to the surface of a substrate film of Sunever B410 (polyimide varnish, product of Nissan Chemical Industries, Ltd.) formed on a glass plate and the result was pre-baked (dried) at 65° C. for 1 hour. After pre-baking, the applied film (thickness: 1.5µ) was directly covered with a negative film mask (product of Toppan Printing Company, Ltd.) and exposed through a Pyrex glass plate to ultraviolet light from a mercury lamp at an exposure rate of 0.4 J/cm$^2$.

The exposed film was then subjected to pattern formation by immersion in a developing solution (organic solvent type, 25° C.) specific for the photosensitive resin film for 2 minutes, whereafter it was rinsed for 10 seconds each in specified solutions (first stage rinsing in an ethanol solution containing 5% N-methyl-2-pyrrolidone; second stage rinsing in ethanol).

The resulting pattern was subjected to reduction treatment by immersion in a 0.5% aqueous solution of sodium borohydride for 1 minute, washed with water, heat treated at 160° C. for 30 minutes and at 230° C. for 30 minutes, and immersed in a 50° C. Ni plating solution (Sumer S680, product of Japan Kanigen Co. Ltd.) for 10 minutes.

Gradual deposition of nickel started about 1 minute after immersion in the plating solution and an electrically conductive pattern exhibiting metallic luster was obtained after 10 minutes. The surface resistivity of the conductive portion was 50 Ω and the masked portion exhibited insulating property. The adherence and pattern precision of the conductive pattern were good.

Example 8

A heat-treated pattern for plating obtained according to Example 7 was immersed in Enplate Cu-408 plating solution (product of Japan Meltex Inc.) at room temperature for 10 minutes. Deposition of copper started about 1 minute after immersion and an electrically conductive pattern exhibiting coppery luster was obtained after 10 minutes. The surface resistivity of the conductive portion was 0.5 Ω and the masked portion exhibited insulating property. The adherence and pattern precision of the conductive pattern were good.

Example 9

A mixed solution having a photosensitive resin concentration of 5 wt % was prepared by adding 5 parts by weight of $PdCl_2$-benzonitrile metal complex dissolved in N-methylpyrrolidone (NMP) to 100 parts by weight of a negative type photosensitive polyimide (Photoneece UR-3100, product of Toray Industries Inc.).

A coat of the mixed solution was applied to the surface of the same type of substrate film as in Example 7 and the result was pre-baked (dried) at 80° C. for 1 hour. After pre-baking, the applied film (thickness: 1.5μ) was exposed at an exposure rate of 0.2 $J/cm^2$ in the same manner as in Example 7.

The exposed film was then subjected to pattern formation by immersion in a developing solution (NMP type, 25° C.) specific for the photosensitive resin film for 2 minutes, whereafter it was rinsed for 15 seconds in isopropanol.

The resulting pattern was subjected to reduction treatment under the same conditions as in Example 7, heat treated at 180° C. for 30 minutes and at 300° C. for 30 minutes, activated in a 5% sodium hypophosphite solution at 50° C. for 1 minute, and immersed in a 50° C. Ni plating solution (Sumer S680, product of Japan Kanigen Co. Ltd.) for 10 minutes.

Gradual deposition of nickel started about 30 seconds after immersion in the plating solution and an electrically conductive pattern exhibiting metallic luster was obtained after 10 minutes. The surface resistivity of the conductive portion was 40 Ω and the masked portion exhibited insulating property. The adherence and pattern precision of the conductive pattern were good. Reference Example 1 (preparation of reduced metal colloid liquid).

500 g of a metallic salt solution was prepared by dissolving 2.5 g of nickel acetate (tetrahydrate) in a solution (497.5 g) obtained by mixing 100 g of dimethylformamide and 397.5 g of ethanol. Separately, a reducing liquid (500 g) was prepared by dissolving 0.8 g of sodium borohydride in ethanol. The reducing liquid was dripped into the metallic salt solution under stirring, whereby there was obtained a black metal colloid dispersion liquid.

When sealed in an air atmosphere and left to stand for two months at room temperature, this colloid dispersion liquid exhibited excellent stability and, specifically, neither experienced any coagulation or precipitation nor suffered any degradation in activity.

Example 10

The reduced metal colloid liquid prepared in Reference Example 1 was diluted with N-methyl-2-pyrrolidone (NMP) and then dispersed in a negative type photosensitive polyimide (Lithocoat PI-400, product of Ube Industries, Ltd.) such that the amount of nickel acetate became 25 PHR, whereby there was obtained a mixed dispersion liquid with a resin concentration of 1 wt %.

A coat of the mixed solution was applied to the surface of a substrate film of Sunever B410 (polyimide varnish, product of Nissan Chemical Industries, Ltd.) formed on a glass plate and the result was pre-baked (dried) at 65° C. for 2 hour. After pre-baking, the applied film (thickness: 5μ) was directly covered with a stainless steel mask and exposed to ultraviolet light from a mercury lamp at an exposure rate of 1 $J/cm^2$.

The exposed film was then subjected to pattern formation by immersion in a developing solution (organic solvent type, 25° C.) specific for the photosensitive resin film for 3 minutes, whereafter it was rinsed for 1 minute each in specified solutions (first stage rinsing in an ethanol solution containing 5% N-methyl-2-pyrrolidone; second stage rinsing in ethanol).

The resulting pattern was heat treated at 160° C. for 30 minutes and at 230° C. for 30 minutes and immersed in a 50° C. Ni plating solution (Sumer S680, product of Japan Kanigen Co. Ltd.) for 5 minutes.

Gradual deposition of nickel started about 20 seconds after immersion in the plating solution and an electrically conductive pattern exhibiting metallic luster was obtained after 5 minutes. The surface resistivity of the conductive portion was 80 Ω and the masked portion exhibited insulating property. The adherence and pattern precision of the conductive pattern were good.

Example 11

A pattern obtained in the same manner as in Example 10 was first activated by immersion in a 5% sodium hypophosphite solution at 50° C. for 1 minute and then immersed in the same Ni plating solution for 3 minutes. About 3 seconds after immersion, nickel began to deposit simultaneously over the entire pattern surface and a conductive pattern like that in Example 10 was obtained after 3 minutes. The surface resistivity of the conductive portion was 7 Ω and the masked portion exhibited insulating property. The adherence and pattern precision of the conductive pattern were good.

Example 12

An activated pattern for plating obtained according to Example 11 was immersed in Enplate Cu-408 copper plating solution (product of Japan Meltex Inc.) at room temperature for 3 minutes. Deposition of copper started about 4 seconds after immersion and an electrically conductive pattern exhibiting coppery luster was obtained after 3 minutes. The surface resistivity of the conductive portion was 0.8 Ω and the masked portion exhibited insulating property. The adherence and pattern precision of the conductive pattern were good.

Example 13

A mask (negative film) produced by Toppan Printing Co., Ltd. was directly applied to the surface of a pre-baked film obtained according to Example 10 and then overlaid with a Pyrex glass plate. The result was exposed to light from a metal halide lamp at an exposure rate of 2 J/cm$^2$, immersed in a developing solution specific for the photosensitive resin film for 2 minutes, and subjected to ultrasonic development, whereby there was obtained a pattern. The pattern was then activated and nickel plated under the same conditions as in Example 10. As a result there was obtained a conductive pattern which had sharp pattern features in the linewidth range upward from 100 μm and also exhibited good conductivity.

The invention makes it possible to obtain a conductive pattern by a simple method. Since the plating is either conducted on the surface of a catalyst layer that is unified with the photosensitive resin film or on a photosensitive resin film which contains dispersed reduced metal colloid particles as a plating catalyst, the conductive (plated) layer according to the invention is not susceptible to the ready exfoliation experienced by conventional electroless plated layers, even though no toughening of the substrate is carried out. As the film application, development, reduction and plating processes can be conducted by immersion, there are no restrictions on the shape or size of the substrate to be processed. It is thus possible to form conductive patterns on various types of substrates suitable for specific purposes.

Moreover, since the adhesive strength, hardness, plating catalytic activity and the like of the film pattern for plating can be regulated as suitable for the use to which the conductive pattern is to be put, it becomes possible to provide various types of metal plating. Further, the fact that the reduction and plating processes can be conducted at a relatively low temperature (10°–90° C.) ensures that there will be little or no adverse effect on the original physical properties of the film.

Another merit of the first aspect of the invention is that where a negative photosensitive resin (e.g. photosensitive polyimide) is used and only the metallic salt or metal complex is removed from the unexposed portion during development, this portion can be used as an insulating film without further treatment. This is advantageous in forming (ultra) fine patterns and for maintaining the adhesive strength of the film.

On the other hand, in the second aspect of the invention there is the advantage that the use of the reduced metal colloid particles eliminates the need for conducting a reduction step during patterning so that a substantial simplification of the patterning process is realized.

What is claimed is:

1. A method of forming electrically conductive patterns having a prescribed pattern comprising successively conducting the steps of (a) applying a photosensitive resin composition consisting of a photosensitive resin and a metallic salt or a metal complex dissolved in a common solvent to a surface of a substrate to form a substrate coated with a film, (b) pre-baking said film coated substrate, (c) exposing said film coated substrate to light through a mask, (d) development of said exposed film coated substrate and (e) post baking said exposed developed film coated substrate, wherein a reduction treatment step is conducted between steps (b) and (c) or between steps (c) and (d); and electroless plating the result of step (e); and wherein the dry thickness of the applied film of the photosensitive resin composition after the post-baking is 0.1–10μ.

2. A method according to claim 1, wherein the metallic salt or metal complex is a salt or a metal complex of a metal selected from Group Ib or Group VIII of the Periodic Table of Elements.

3. A method according to claim 1, wherein the metallic salt is one or more members selected from the group consisting of sulfates, nitrates, chlorides and organic salts of iron, cobalt, nickel, copper, rhodium, palladium, silver, platinum and gold.

4. A method according to claim 1, wherein 5–100 parts by weight of the metallic salt or 1–100 parts by weight of the metal complex are used per 100 parts by weight of the photosensitive resin.

5. A method according to claim 1, wherein the substrate is a copper-plated laminated sheet, a metal sheet, a plastic sheet, a plastic film or a ceramic sheet.

6. A method according to claim 1 wherein the reduction step is conducted using a solution containing 0.01–20 weight percent of a reducing agent at a temperature between 10° C. and 90° C. for a period of between 10 seconds and 30 minutes.

* * * * *